United States Patent
Ryowa et al.

(10) Patent No.: US 7,327,770 B2
(45) Date of Patent: Feb. 5, 2008

(54) NITRIDE SEMICONDUCTOR LASER DEVICE

(75) Inventors: Tatsuya Ryowa, Osaka (JP); Masaya Ishida, Kashihara (JP); Yukiko Morishita, Kyoto (JP); Takeshi Kamikawa, Mihara (JP); Kensaku Motoki, Mino (JP)

(73) Assignees: Sharp Kabushiki Kaisha, Osaka (JP); Sumitomo Electric Industries, Ltd., Osaka (JP)

( * ) Notice: Subject to any disclaimer, the term of this patent is extended or adjusted under 35 U.S.C. 154(b) by 264 days.

(21) Appl. No.: 10/831,687

(22) Filed: Apr. 26, 2004

(65) Prior Publication Data

US 2005/0025205 A1  Feb. 3, 2005

(30) Foreign Application Priority Data

Apr. 24, 2003  (JP) ............................. 2003-120130

(51) Int. Cl.
*H01S 5/00* (2006.01)

(52) U.S. Cl. ................................. 372/44.01; 372/43.01

(58) Field of Classification Search ............. 372/45.01, 372/43.01, 44.01, 46.06
See application file for complete search history.

(56) References Cited

U.S. PATENT DOCUMENTS

| | | | |
|---|---|---|---|
| 6,836,498 B2 * | 12/2004 | Takeya et al. ............ | 372/45.01 |
| 6,855,959 B2 | 2/2005 | Yamaguchi et al. | |
| 6,950,451 B2 * | 9/2005 | Tojo et al. ..................... | 372/23 |
| 2001/0032975 A1 * | 10/2001 | Yamaguchi et al. .......... | 257/13 |
| 2005/0025204 A1 * | 2/2005 | Kamikawa et al. ........... | 372/43 |
| 2005/0042787 A1 * | 2/2005 | Ito et al. ........................ | 438/41 |
| 2005/0048682 A1 * | 3/2005 | Takatani et al. .............. | 438/22 |
| 2005/0141577 A1 * | 6/2005 | Ueta et al. ..................... | 372/43 |
| 2005/0249255 A1 * | 11/2005 | Dwilinski et al. ....... | 372/49.01 |

FOREIGN PATENT DOCUMENTS

| | | |
|---|---|---|
| EP | 1071143 A1 | 1/2001 |
| JP | 11-145515 A | 5/1999 |
| JP | 11-312841 | 11/1999 |

(Continued)

OTHER PUBLICATIONS

Reshchikov, M.A. et al. (2001). "Yellow and Green Luminescence in a Freestanding GaN Template," *Applied Physics Letters* 78(20):3041-3043.

*Primary Examiner*—Dung T. Nguyen
(74) *Attorney, Agent, or Firm*—Morrison & Foerster LLP

(57) ABSTRACT

To prevent deterioration induced by wire bonding in a laser device incorporating a semiconductor laser element having a nitride semiconductor laid on top of a nitride semiconductor substrate, the position at which a wire (301) is bonded to an electrode (113) formed on the top surface of a semiconductor layered structure is located off the area right above a dislocation (crystal defect)-concentrated region (X) of the substrate. Concentration of dislocations in the substrate spreads to the layered structure, producing a dislocation-concentrated region in the part of the layered structure located right above the dislocation-concentrated region of the substrate. If a wire is bonded above this region, the pressure applied when the wire is bonded causes the metal of which the electrode is made to diffuse along the concentrated dislocations, lowering the quality of the layered structure and thus resulting in deterioration of the element. Bonding a wire elsewhere than above the dislocation-concentrated region (X) helps prevent such deterioration.

6 Claims, 9 Drawing Sheets

FOREIGN PATENT DOCUMENTS

| | | |
|---|---|---|
| JP | 11-340571 A | 12/1999 |
| JP | 2000-021789 A | 1/2000 |
| JP | 2001-102307 | 4/2001 |
| JP | 2001-274521 A | 10/2001 |
| JP | 2003-124115 | 4/2003 |
| JP | 2003-124572 | 4/2003 |
| JP | 2003-124573 | 4/2003 |
| JP | 2003-229623 | 8/2003 |
| JP | 2003-229631 | 8/2003 |
| JP | 2003-229638 | 8/2003 |
| WO | WO-99/30373 A1 | 6/1999 |

\* cited by examiner

NITRIDE SEMICONDUCTOR LASER DEVICE

This nonprovisional application claims priority under 35 U.S.C. § 119(a) on Patent Application No. 2003-120130 filed in Japan on Apr. 24, 2003, the entire contents of which are hereby incorporated by reference.

BACKGROUND OF THE INVENTION

1. Field of the Invention

The present invention relates to a semiconductor laser device incorporating a semiconductor laser element using a group III nitride semiconductor.

2. Description of Related Art

In general, group III nitride semiconductors of the formula $In_xGa_yAl_zN$ (where $x+y+z=1$, $0 \leq x \leq 1$, $0 \leq y \leq 1$, and $0 \leq z \leq 1$) have large energy band gaps and high thermal stability, and their band gap widths can be controlled through adjustment of their composition. For these reasons, group III nitride semiconductors have been researched for application in various semiconductor devices such as light-emitting elements and high-temperature devices. In the field of light-emitting elements, there have already been put into practical use light-emitting diodes (LEDs) that offer luminous intensity of the order of several candelas in a blue to green region of the spectrum. Also in the field of laser diodes (LDs), researches are being made steadily for commercialization.

With respect to LDs, there have conventionally been developed devices that use an insulating substrate made of a material that is comparatively readily available, such as sapphire. Recently, however, with a view to resolve lattice mismatching between a substrate and an epitaxial layer, to reduce defects, to obtain good cristallinity, and out of other considerations, devices using a GaN substrate have been developed increasingly eagerly. For example, Japanese Patent Application Laid-Open No. H11-312841 discloses a nitride semiconductor laser element using a GaN substrate.

The substrate of a semiconductor laser element needs to have low defect density. For this reason, according to one conventionally proposed technique, defects are concentrated in a particular region (the dislocation-concentrated region) within the substrate, and a laser waveguide is formed on the remaining region (the low-dislocation region). This permits laser operation to take place in a region with fewer defects, and thus helps prolong the useful life of the element. However, a problem arises when a semiconductor laser element using such a substrate undergoes a wire-bonding process in which wires of Au or Al are bonded thereto through which to permit a drive electric current to be fed thereto, because this process has been found to cause a new deterioration in the element.

SUMMARY OF THE INVENTION

An object of the present invention is to provide a semiconductor laser device that is insusceptible to deterioration induced by wire-bonding.

To achieve the above object, according to the present invention, a nitride semiconductor laser device is provided with: a semiconductor laser element including a substrate made of a group III nitride semiconductor, a layered structure formed on the top surface of the substrate and made of a group III nitride semiconductor, and an electrode formed on the top surface of the layered structure; a support base for keeping the semiconductor laser element fixed in position; and a wire connected to the electrode to permit a drive electric current to be fed therethrough to the semiconductor laser element. In this nitride semiconductor laser device, the substrate has a dislocation-concentrated region penetrating the substrate from the top surface to the bottom surface thereof and a low-dislocation region corresponding to the entire region of the substrate except the dislocation-concentrated region. Moreover, the layered structure has a stripe-shaped laser light waveguide region located above the low-dislocation region of the substrate. Moreover, the semiconductor laser element is fixed on the support base with the substrate-side surface of the semiconductor laser element facing the support base. Moreover, the wire is connected to the electrode above the low-dislocation region.

The dislocation-concentrated region of the substrate spreads to the layered structure that is epitaxially grown on top of the substrate, and produces a dislocation-concentrated region in the part of the layered structure located right above the dislocation-concentrated region of the substrate. If this fact is disregarded, in the wire-bonding process, the wire may be bonded above the dislocation-concentrated region. If this is done, electric current is likely to flow through the dislocation-concentrated region, with no electric current flowing through the waveguide region in the active layer, or only an insufficient amount of electric current flowing through the waveguide region. If this happens, the element may not oscillate at all, or may deteriorate so quickly, after being driven for only a short period of time, as to be practically unusable.

By contrast, according to the present invention, the wire is bonded to the electrode above the low-dislocation region of the substrate, that is, off the dislocation-concentrated region. This makes less likely for electric current to flow through the dislocation-concentrated region in the layered structure, and thus helps increase the yield rate and also prolong the life of the element over which it oscillates usefully. In an actually conducted experiment, when wires were bonded above dislocation-concentrated regions, the yield rate in the wire-bonding process was 67%; by contrast, when wires were bonded above low-dislocation regions, the yield rate in the wire-bonding process was 100%.

Attention should be paid to the following special usage of the terms "dislocation-concentrated region" and "low-dislocation region" in the present specification. Originally, these terms both apply to regions located within the substrate. In the present specification, however, to simplify descriptions, not only with respect to the substrate but also with respect to the layered structure formed on top of the substrate and the electrode formed further on top thereof, those parts thereof which are located in the areas overlapping, as seen from above, the dislocation-concentrated region and low-dislocation region of the substrate are occasionally referred to as the "dislocation-concentrated region" and "low-dislocation region".

BRIEF DESCRIPTION OF THE DRAWINGS

This and other objects and features of the present invention will become clear from the following description, taken in conjunction with the preferred embodiments with reference to the accompanying drawings in which.

DETAILED DESCRIPTION OF PREFERRED EMBODIMENTS

First, the GaN substrate used in a semiconductor laser according to the present invention will be discussed, with a description given also of the fabrication procedure thereof, and thereafter the principle of the present invention will be discussed. It should be noted that, in the following description, a negative index in a formula indicating a plane or direction of a crystal will be represented by a negative sign "−" followed by the absolute value of the index instead of the absolute value accompanied by an overscore placed thereabove as required by convention in crystallography, simply because the latter notation cannot be adopted in the present specification.

Figure 8A:
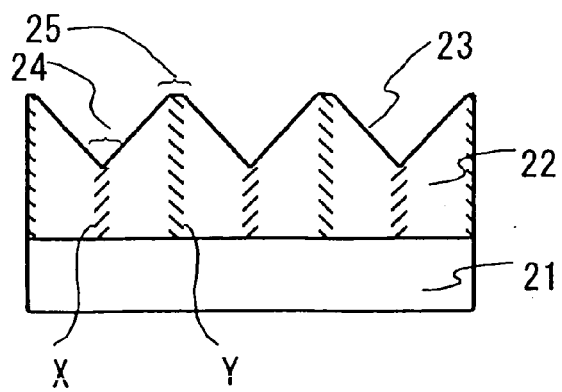
FIGS. 8A to 8E are diagrams schematically showing the fabrication procedure and structure of the nitride semiconductor substrate.

FIGS. 8A to 8E show the fabrication procedure of the substrate. First, a support base 21 is prepared by laying stripe-shaped masks periodically on the surface of an appropriate wafer (FIG. 8A). Here, used as the wafer is a 2-inch GaAs wafer having the (111) plane at the surface, and used as the mask is $SiO_2$.

Next, by HVPE (hydride vapor phase epitaxy), an n-type GaN layer 22 is grown in such a way that the {11-22} facet 23 mainly appears at the surface being grown. As a result, the surface comes to have a serrated sectional shape with ridges and troughs. In FIG. 8A, reference numeral 24 represents the bottommost parts of the troughs, and, near the topmost parts of the ridges appears the {0001} facet in the shape of stripes.

The ridges and troughs mentioned above extend, like those found in a farm field, in the depth direction of FIG. 8A, and the pitch at which they are located depend on how the $SiO_2$ masks are arranged. Specifically, right below the troughs are laid the $SiO_2$ masks, and a line drawn downward from any ridge perpendicularly thereto passes through approximately the middle point of the opening between two adjacent $SiO_2$ masks.

Here, the $SiO_2$ masks are arranged periodically at a 400 μm pitch (in the shape of stripes extending in the depth direction of the figure), and accordingly the ridges and troughs are located at the same pitch of 400 μm. The direction in which the openings between the masks extend is approximately parallel to the [1-100] direction of the n-type GaN layer 22.

Here, it is because the $SiO_2$ masks are laid in the shape of stripes that the n-type GaN layer 22 has ridges and troughs at the surface thereof. It is, however, also possible to lay the $SiO_2$ masks otherwise than in the shape of stripes, for example in the shape of dots. In that case, the n-type GaN layer 22 has, at the surface thereof, an array of bowl-shaped depressions having the bottoms thereof located right above the masks, and the {11-12} facet appears at the slanted surfaces of the bowls. A technique of (conditions for) maintaining the growth of a crystal while keeping the {11-12} facet at the surface is disclosed in detail in Japanese Patent Application filed as No. H11-273882 by the applicant of the present invention. When the crystal is grown, it is doped with oxygen so as to be given n-type conductivity.

Figure 8B:
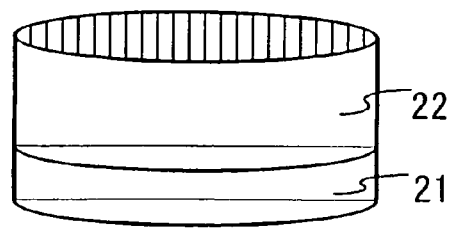

The crystal growth of the n-type GaN layer is continued while the growth mode in which ridges and troughs are formed at the surface as described above is maintained, until a 30 mm high ingot is produced on top of the base 21. FIG. 8B is a perspective view schematically showing the exterior appearance of the ingot. In the figure, the lines drawn across the top surface of the ingot symbolize the ridges and troughs at the surface.

Figure 8C:
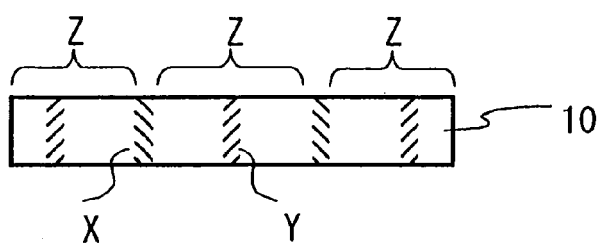
Figure 8D:
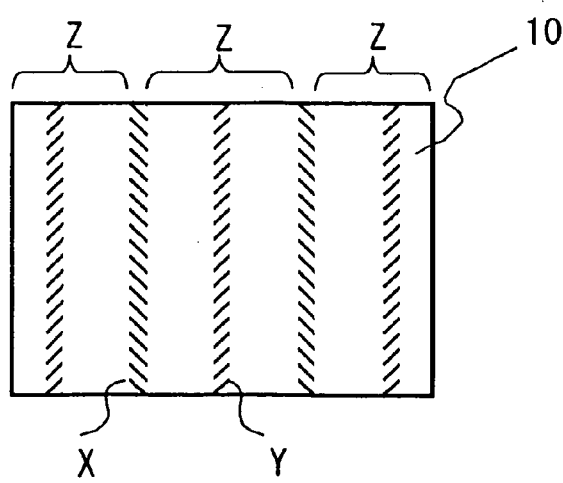

Using a slicer, this ingot is sliced into thin sheets, of which each is then polished into a flat-surfaced wafer 2 inch in diameter and 350 μm thick. The surface of this wafer is polished into a mirror-smooth surface so as to be ready for epitaxial growth performed later. This surface is aligned approximately with the (0001) plane. More specifically, comparing different morphologies of the nitride semiconductor layer epitaxially grown on the surface leads to a conclusion that it is preferable that the surface have an off-angle in the range from 0.2° to 1° in any direction relative to the (0001) plane. In particular, in the range of off-angles from 0.4° to 0.8°, the best morphologies are obtained. FIGS. 8C and 8D are a sectional view and a top view, respectively, of (part of) the thus produced n-type GaN substrate 10.

The n-type GaN substrate 10 as actually produced was evaluated as follows. First, the surface of the substrate was minutely inspected under an optical microscope. The polished surface was not perfectly flat, but slight depressions were observed along the stripe-shaped regions that corresponded to the bottommost parts 24 of the troughs formed during the crystal growth of the n-type GaN layer 22. Those regions correspond to the areas indicated by X in FIG. 8D.

Moreover, the n-type GaN substrate 10 was dipped in a mixed acid of sulfuric acid and phosphoric acid at 250° C., and then the etch pits thereby exposed at the surface thereof were observed. A large number of etch pits were observed in the stripe-shaped regions corresponding to the troughs mentioned above, attesting to the high concentration of dislocations (crystal defects) in those regions. Since dislocation-concentrated parts have lower mechanical strength than the other parts, they are liable to be damaged in the polishing process. This is considered to be the reason that depressions were formed at the surface of the substrate. The stripe-shaped parts where dislocations concentrated were about 10 μm to 40 μm wide, and the density of etch pits in these parts was extremely high, specifically of the order of $10^5$ to $10^9/cm^2$. By contrast, the density of etch pits elsewhere than those stripe-shaped parts was low, specifically of the order of $10^2$ to $10^5/cm^2$.

As these results show, the areas indicated by X in FIGS. 8A and 8C are where the dislocation density is higher than elsewhere, and, in the following description, these areas are called "dislocation-concentrated regions", and the areas other than those are called "low-dislocation regions". Concentrating the dislocation-concentrated regions results in better crystallinity in the low-dislocation regions. In FIGS. 8C and 8D, the areas indicated by Z are low-dislocation regions.

Figure 8E:
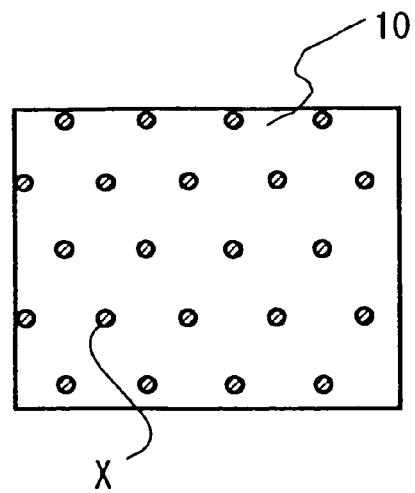

FIG. 8E is a top view of the GaN substrate as observed when the $SiO_2$ masks are laid in the shape of dots. The defect regions X concentrated in the shape of dots are about 10 μm to 50 μm in diameter, and are located at intervals of about 400 μm.

Next, the n-type GaN substrate 10 was irradiated with ultraviolet light, and the resulting fluorescence from the surface was observed under a microscope (fluorescence microscope inspection). In this inspection, along the middle lines of the regions located between the dislocation-concentrated regions, stripe-shaped light-emitting parts were observed that had comparatively clear boundaries and were differently contrasted from elsewhere. In these light-emitting parts, the intensity of fluorescence was higher then elsewhere, and bright yellowish fluorescence was observed.

These parts correspond to the parts 25 where growth proceeded with the {0001} facet kept appearing at the surface during the crystal growth of the n-type GaN layer 22, and thus correspond to the areas indicated by Y in FIGS. 8C and 8D. These parts have slightly varying widths, being about 30 μm wide where they are widest. The reason for this variation in width is considered to be that the ridges 25 do not always grow uniformly during the crystal growth of the n-type GaN layer 22. On the other hand, the reason that fluorescence different from elsewhere is observed is supposed to be that the dopant is absorbed differently from elsewhere.

Incidentally, these parts Y exhibiting different fluorescence may hardly be formed depending on the conditions under which the ingot is produced and the position within the ingot of the particular wafer sliced out thereof (i.e., the distance from the support base 21). In the following description, these parts are also called the "high-luminescence regions".

Figure 9:
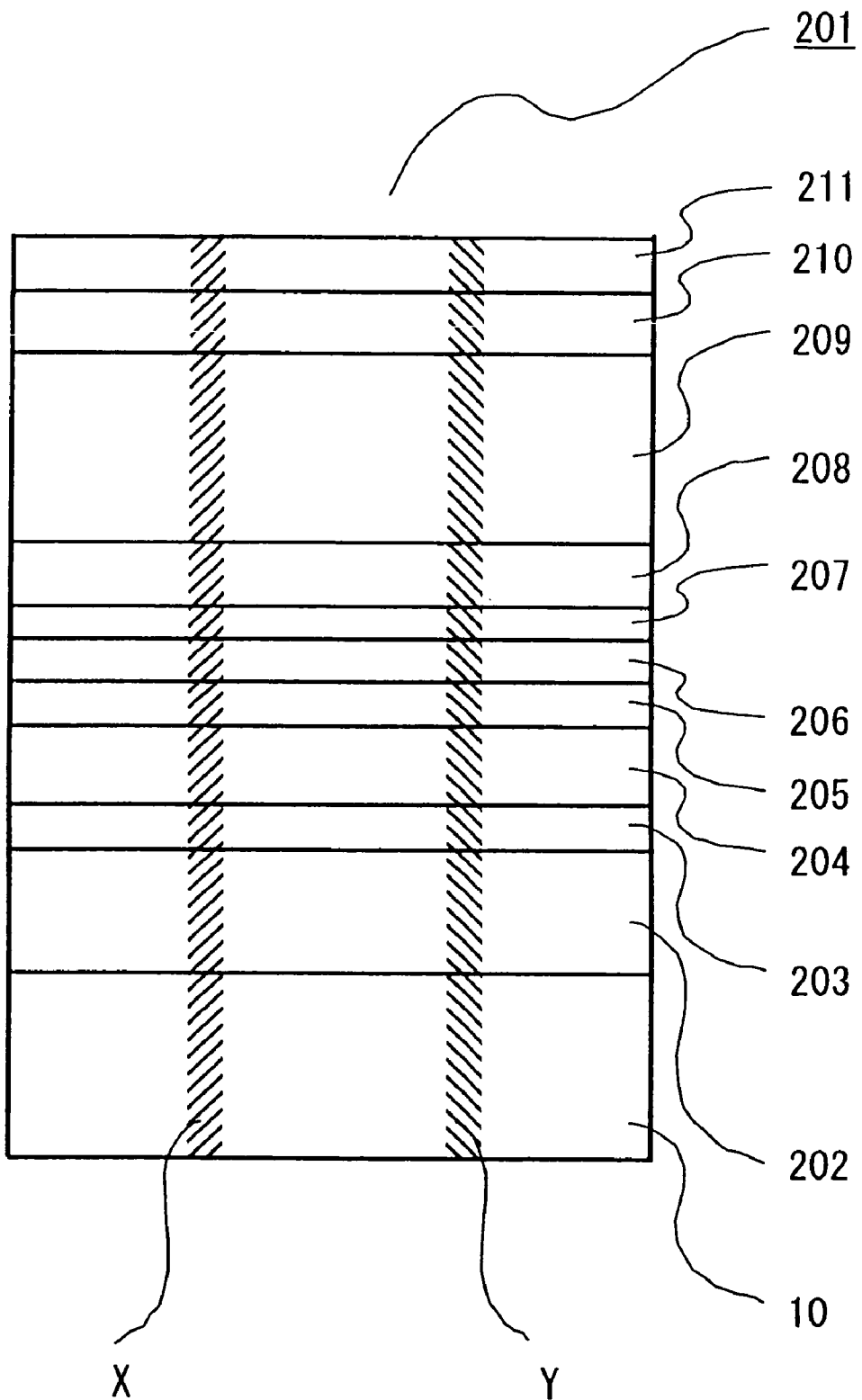
FIG. 9 is a sectional view schematically showing a semiconductor laser element before the formation of an electrode to illustrate the principle of the present invention.

Next, the principle of the present invention will be explained. FIG. 9 is a sectional view showing a semiconductor laser element as observed in the middle of the fabrication procedure thereof. On top of the n-type GaN substrate 10 structured as described above, a crystal is grown by laying the following layers on top of one anther by MOCVD: a 3 μm thick n-type GaN layer 202, a 40 nm thick n-type $In_{0.07}Ga_{0.93}N$ crack prevention layer 203, a 1.2 μm thick n-type $Al_{0.1}Ga_{0.9}N$ clad layer 204, a 0.1 μm GaN light guide layer 205, a triple quantum well active layer 206 composed of alternately laid 4 nm thick $In_{0.1}Ga_{0.9}N$ well layers and 8 nm thick $In_{0.01}Ga_{0.99}N$ barrier layers (a barrier layer, a well layer, a barrier layer, a well layer, a barrier layer, a well layer, and a barrier layer), a 20 nm thick p-type $Al_{0.3}Ga_{0.7}N$ carrier block layer 207, a 0.1 μm thick p-type GaN light guide layer 208, a 0.5 μm p-type $Al_{0.1}Ga_{0.9}N$ clad layer 209, a 0.1 μm p-type GaN first contact layer 210, and a 50 nm thick p-type $In_{0.15}Ga_{0.85}N$ second contact layer 211. In this way, a group III nitride semiconductor layered structure 201 is produced.

When a section of this group III nitride semiconductor layered structure 201 as actually produced was inspected under a transmission electron microscope, dislocations (crystal defects) were observed penetrating discrete parts of the layered structure from the bottom surface of the n-type GaN substrate 10 to the top surface of the p-type GaN contact layer 210. These defect-penetrated parts occurred periodically, at a pitch of about 400 μm.

Furthermore, when a part around the interface between the substrate and the epitaxial layer was inspected, it was found that the defect-penetrated parts connected to the dislocation-concentrated regions indicated by X in the n-type GaN substrate 10, and thus that defects originating as crystal defects in the substrate spread into the epitaxial layer, penetrating it to reach the top surface of the p-type GaN contact layer 210. The dislocation-concentrated regions have nitrogen end surfaces.

As described earlier, the presence of many such dislocations penetrating the semiconductor layered structure increases leak electric current through the element, leading to increased operating current and quick deterioration.

Figure 10:
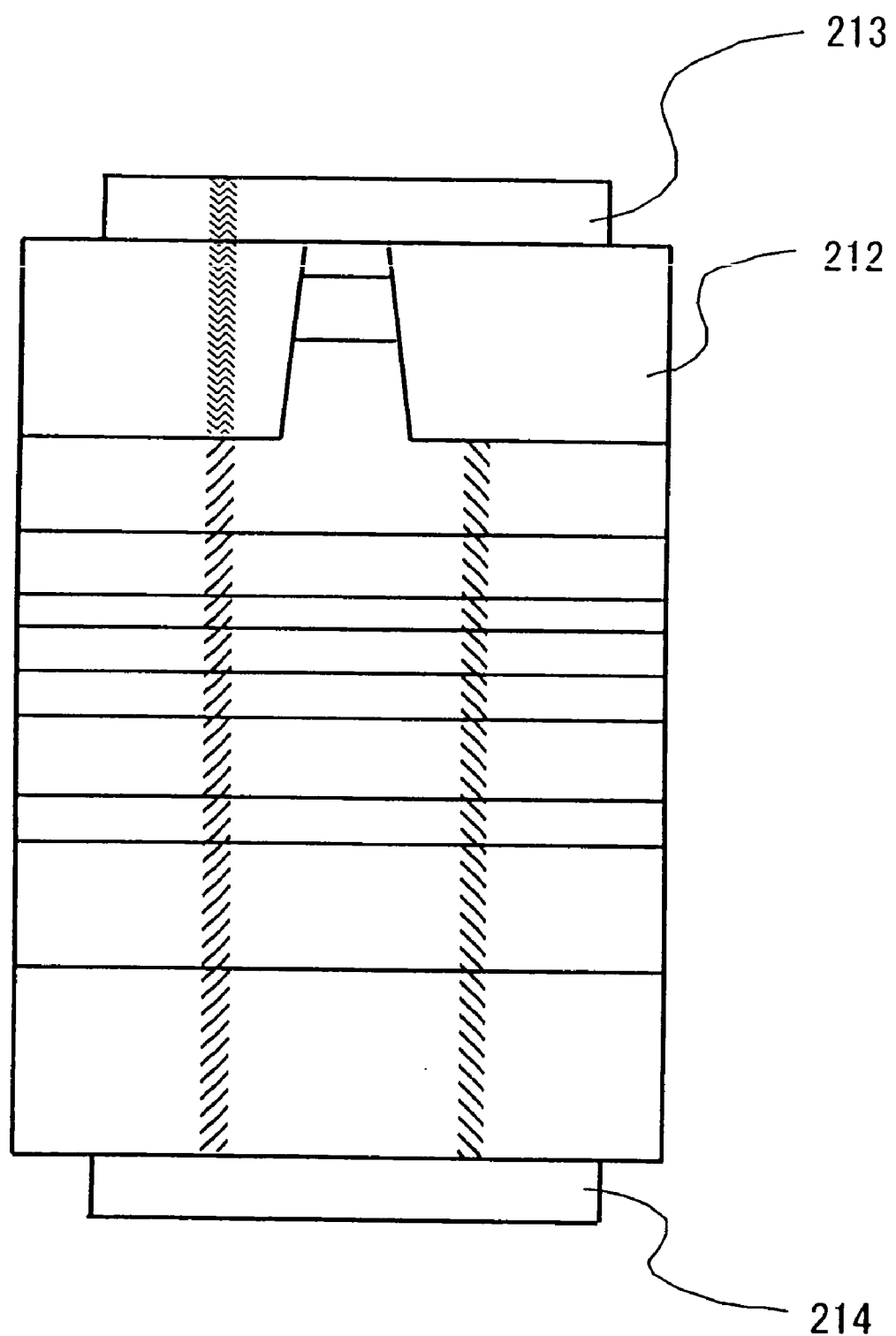
FIG. 10 is a sectional view schematically showing a semiconductor laser element after the formation an electrode to illustrate the principle of the present invention.

A more detailed description will be given below with reference to FIG. 10. FIG. 10 is a sectional view showing the structure of a ridge-stripe-type semiconductor laser that is produced by further processing the group III nitride semiconductor layered structure 201 laid as shown in FIG. 9 in the following manner. Dry etching is performed so as to remove parts of the layered structure from the top surface of the p-type contact layer 211 to about the middle of the p-type clad layer 209 to form a ridge structure. Then, in the parts removed by etching is buried an $Al_{0.1}Ga_{0.9}N$ layer 212 by growing it anew. Then, a p-type electrode 213 and an n-type electrode 214 are formed respectively on the top surface of the p-type contact layer 211 and on the bottom surface of the n-type GaN substrate 10.

The surface of the p-type clad layer 209 after the removal of parts thereof by etching is rough as a result of defects in the substrate spreading thereto. Accordingly, the buried $Al_{0.1}Ga_{0.9}N$ layer 212 and the p-type electrode 213 are grown under the influence of the rough surface of the p-type clad layer 209, resulting in the p-type electrode 213 having a rough surface.

In general, in a semiconductor laser element, the region within the active layer thereof which is fed with an electric current to contribute to light emission (in FIG. 10, the part located immediately under the ridge stripe structure) needs to include as few crystal defects as possible. The presence of crystal defects is liable to cause, when the element is driven and an electric current is fed to the active layer, proliferation of defects, resulting in poorer crystallinity of the active layer and lower light emission efficiency, thus degrading the characteristics of the element.

The position of the current injection region in the active layer is determined according to where on the semiconductor layered structured is formed the current injection part (in the example shown in FIG. 10, the ridge structure) on the surface of the contact layer. Thus, according to common sense, where to form the ridge structure is determined so as to avoid dislocation-concentrated region as shown in FIG. 10.

The ridge structure should also be formed so as to avoid high-luminescence region. The reason is that, as described earlier, high-luminescence regions exhibit greatly different luminescent characteristics because they absorb the dopant differently from elsewhere and for other reasons, and this makes it difficult to obtain the wavelength just as designed in the semiconductor laser as an end product.

With consideration given to these facts, in practice, it is necessary to form the ridge structure in the middle part between the dislocation-concentrated region and the high-luminescence region, i.e., the part of the n-type GaN layer 22 where it grew while keeping the {11-22} facet appearing at the surface (the parts indicated by reference numeral 23 in FIG. 8A).

Moreover, in general, an electrode part of a semiconductor laser needs not only to make contact with a ridge stripe part but also to have a certain width and a certain length so as to permit a power feeding Al or Au wire to be pressure-bonded to the surface of the electrode (wire-bonding) or to permit the electrode itself to be fused to a stem or the like. In FIG. 10, the p-type electrode 213 and the n-type electrode 214 are so patterned as to have a certain width. These, however, do not necessarily have to be patterned, but may be so formed as to extend over the whole surfaces. Thus, it often occurs that the electrodes cover the dislocation-concentrated region as shown in FIG. 10.

However, problems arise when, in a case where the electrodes cover the dislocation-concentrated region X, a wire is bonded to the part of the p-type electrode located right above the dislocation-concentrated region X. If this is done, the metal of which the electrode is made may diffuse into the semiconductor layer along defects under the mechanical pressure applied during wire-bonding. Or, the degenerated crystal in defect-ridden parts may show a lower resistance than the normal crystal, permitting an electric current to flow through the semiconductor layer along defects.

The diffusion of the metal into the semiconductor layer leads to deterioration in the quality of the active layer and of the semiconductor layer located around it. The injection of an electric current into the other part of the active layer than the light-emitting region causes a leak electric current that does not contribute to light output. These result in increased operating current through and quick deterioration of the element.

With the current technology, it is extremely difficult to completely eliminate the generation of dislocation-concentrated regions in a group III nitride semiconductor element using a substrate like the n-type GaN substrate 10. In view of this fact, to avoid adverse effects as described above on the characteristics, it is necessary to ingeniously avoid dislocation-concentrated regions when wire-bonding is performed. Hereinafter, embodiments of the present invention will be described wherein considerations are made in this respect.

First Embodiment

Figure 1:
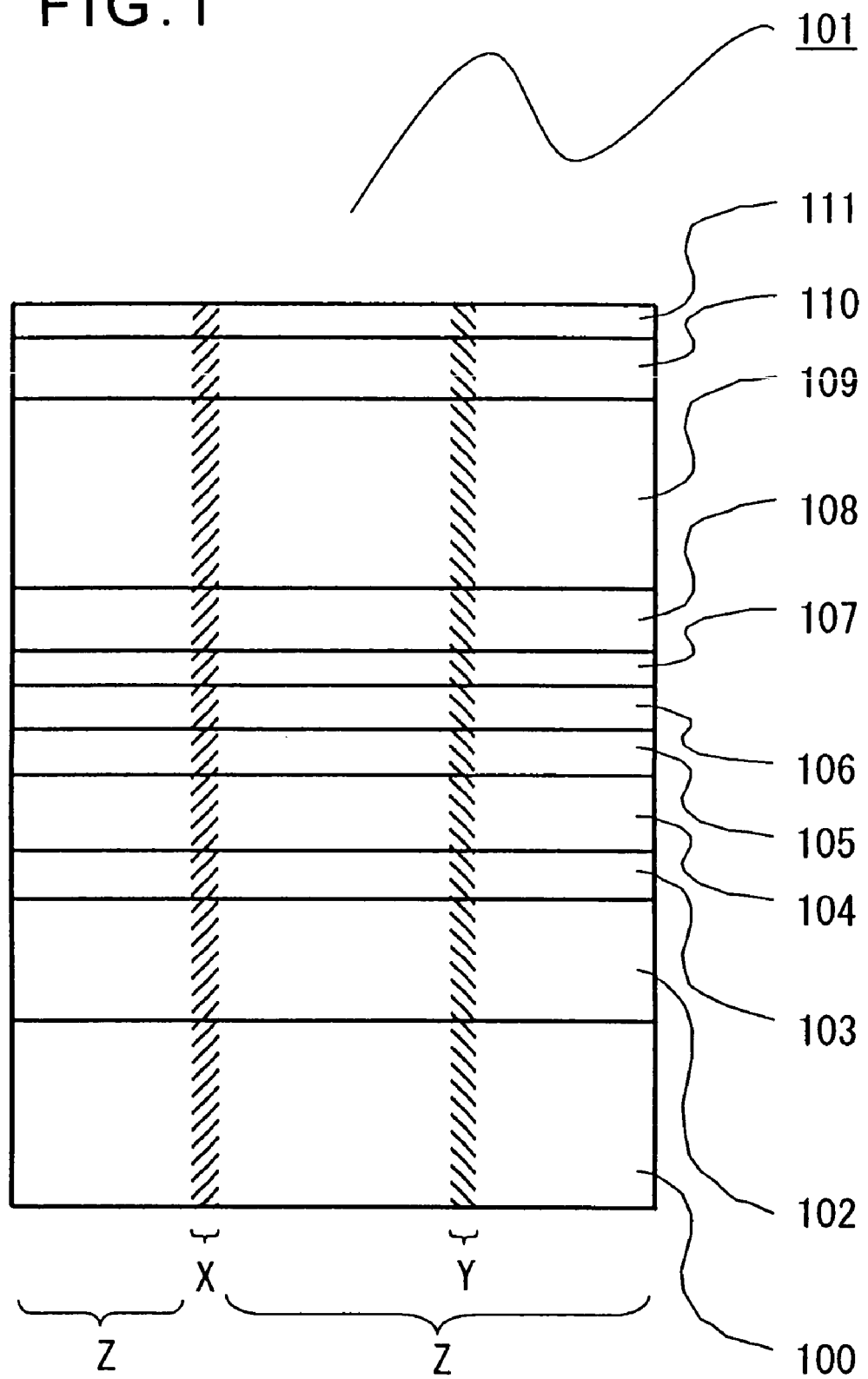
FIG. 1 is a sectional view schematically showing the semiconductor layered structure as observed when the semiconductor laser element of a first embodiment of the invention is in the process of being fabricated.
Figure 2:
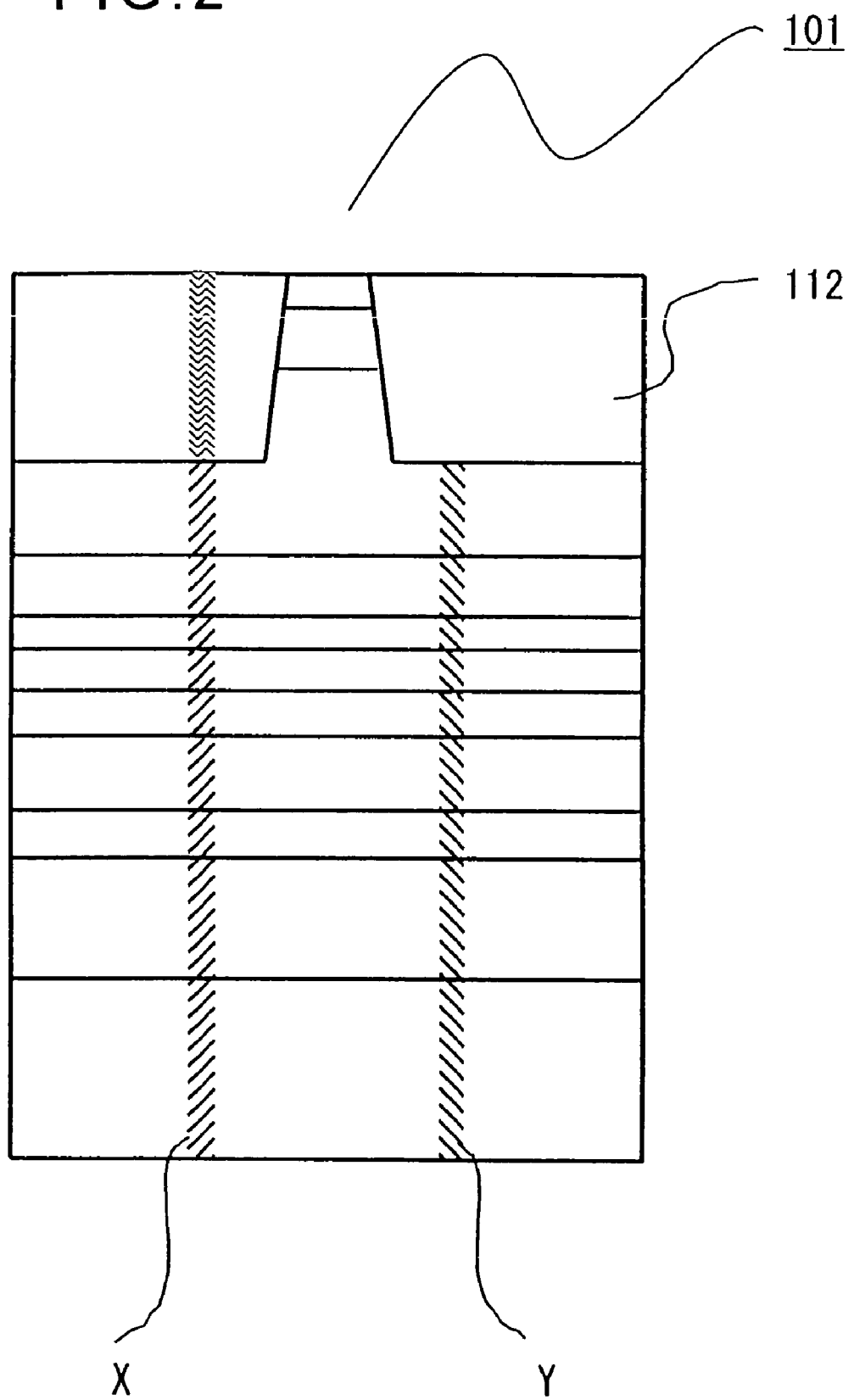
FIG. 2 is a sectional view schematically showing the semiconductor laser element of the first embodiment, before the formation of the electrode.
Figure 3:
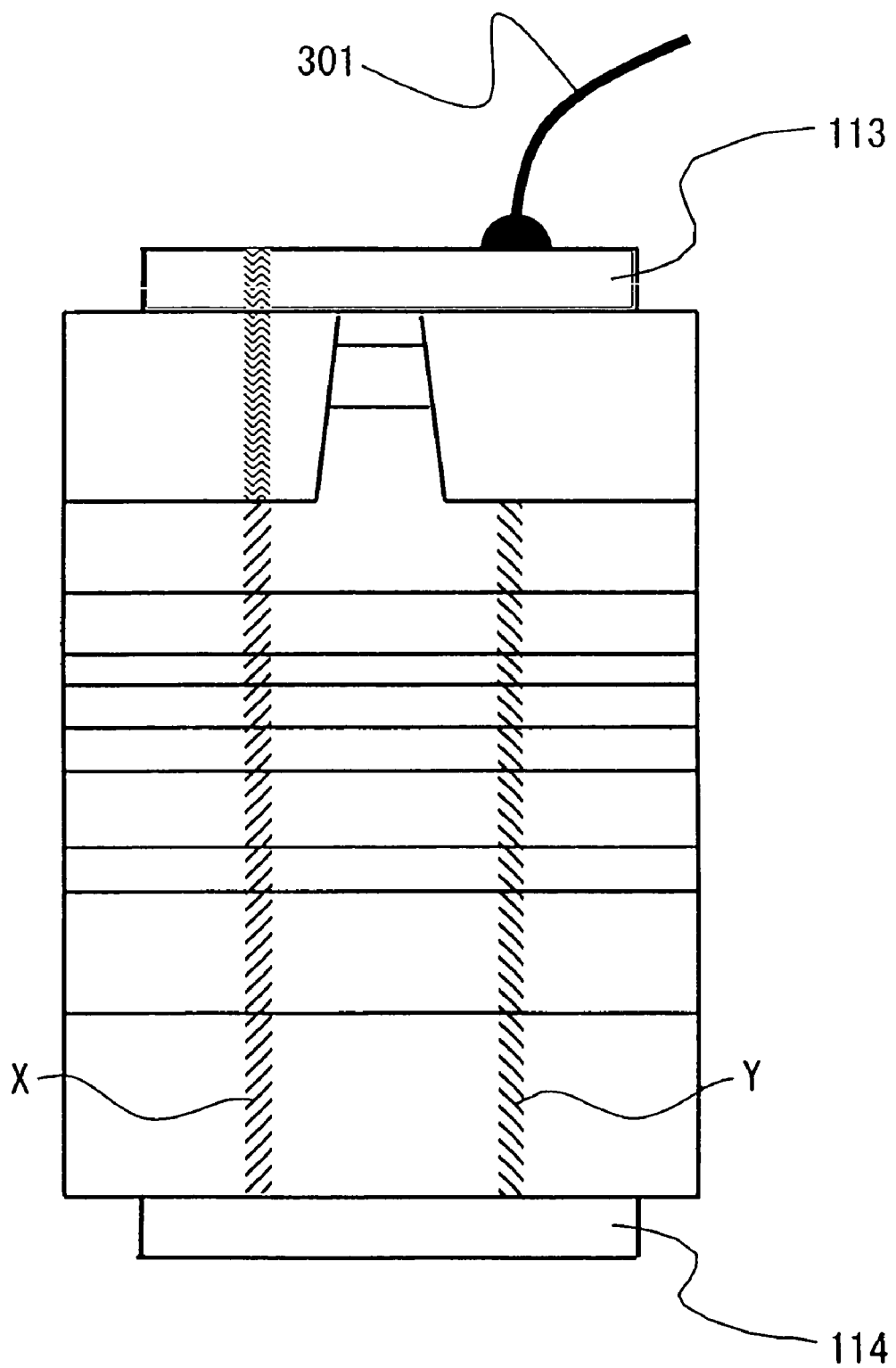
FIG. 3 is a sectional view schematically showing the semiconductor laser element of the first embodiment, after the formation of the electrode.

FIGS. 1 to 3 are sectional views schematically showing the structures of the semiconductor laser element of a first embodiment of the invention. In these figures are shown dislocation-concentrated regions X, high-luminescence regions Y, and low-dislocation regions Z.

The semiconductor laser element shown in FIG. 1 is structured as follows. On top of an n-type GaN substrate 100 produced by the same fabrication procedure as the n-type GaN substrate 10 described earlier, a crystal is grown by laying the following layers on top of one anther by MOCVD: a 3 μm thick n-type GaN layer 102, a 40 nm thick n-type $In_{0.07}Ga_{0.93}N$ crack prevention layer 103, a 1.2 μm thick n-type $Al_{0.1}Ga_{0.9}N$ clad layer 104, a 0.1 μm GaN light guide layer 105, a triple quantum well active layer 106 composed of alternately laid 4 nm thick $In_{0.1}Ga_{0.9}N$ well layers and 8 nm thick $In_{0.01}Ga_{0.99}N$ barrier layers (a barrier layer, a well layer, a barrier layer, a well layer, a barrier layer, a well layer, and a barrier layer), a 20 nm thick p-type $Al_{0.3}Ga_{0.7}N$ carrier block layer 107, a 0.1 μm thick p-type GaN light guide layer 108, a 0.5 μm p-type $Al_{0.1}Ga_{0.9}N$ clad layer 109, a 0.1 μm p-type GaN first contact layer 110, and a 50 nm thick p-type $In_{0.15}Ga_{0.85}N$ second contact layer 111. In this way, a group III nitride semiconductor layered structure 101 is produced.

Thereafter, as shown in FIG. 2, ridge structures are formed periodically along the middle lines between the dislocation-concentrated regions X and the high-luminescence regions Y. The ridge structures are formed by performing dry etching so as to remove parts of the layered structure from the top surface of the p-type contact layer 111 to about the middle of the p-type clad layer 109, and then in the parts removed by etching is buried an $Al_{0.1}Ga_{0.9}N$ layer 112 by growing it anew. Here, the $Al_{0.1}Ga_{0.9}N$ layer 112 may of the n- or i-type. The $Al_{0.1}Ga_{0.9}N$ layer 112 has only to be an insulating layer, and may thus be formed of, instead of nitride as in this embodiment, oxide such as $SiO_2$ or $TiO_2$.

Thereafter, a p-type electrode 113 and an n-type electrode 114 are formed. In a case where the dislocation-concentrated regions X lie in the shape of lines as seen from above the surface on which the crystal was epitaxially grown, the low-dislocation regions, i.e., the regions other than the dislocation-concentrated regions, lie in the shape of stripes with a greater width. Thus, as shown in FIG. 3, when the p-type electrode or n-type electrode is formed on the top surface of the p-type contact layer 111 or on the bottom surface of the n-type GaN substrate 10, the metal of which the electrode is made covers the dislocation-concentrated region X, but, by bonding a wire elsewhere than directly in the dislocation-concentrated region X, it is possible to avoid the characteristics of the element from being affected adversely.

Figure 4:
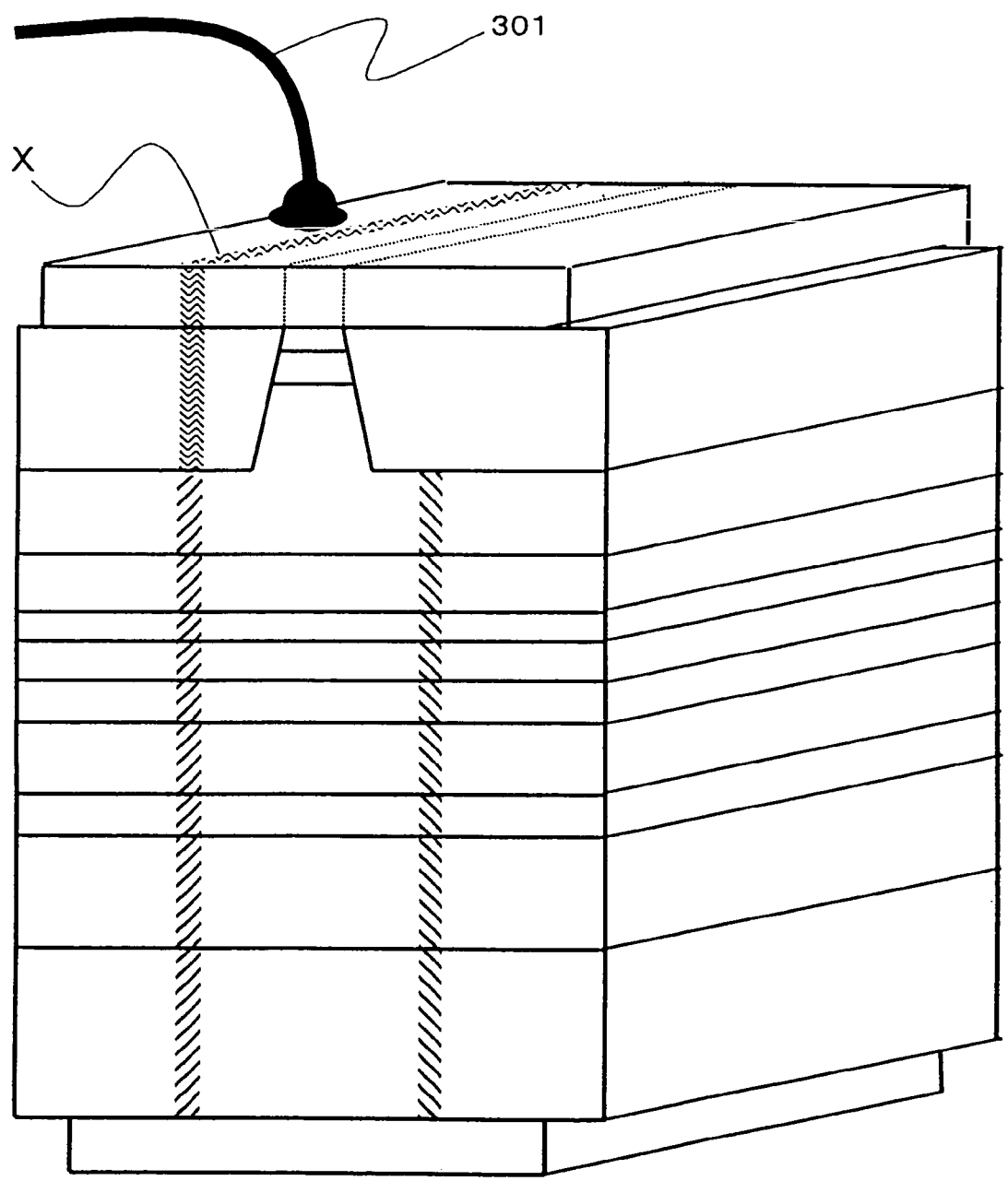
FIG. 4 is a perspective view schematically showing the semiconductor laser element of the first embodiment, with a wire connected thereto.

The influence of the high-luminescence regions Y does not reach the $Al_{0.1}Ga_{0.9}N$ layer 112. Thus, as shown in FIG. 3, a wire 301 may be bonded right above the high-luminescence region Y. Thus, a wire may be bonded anywhere above the low-dislocation region, i.e., anywhere off the dislocation-concentrated region. FIG. 4 shows a perspective view of another example in which a wire is bonded off the dislocation-concentrated region X.

Figure 5:
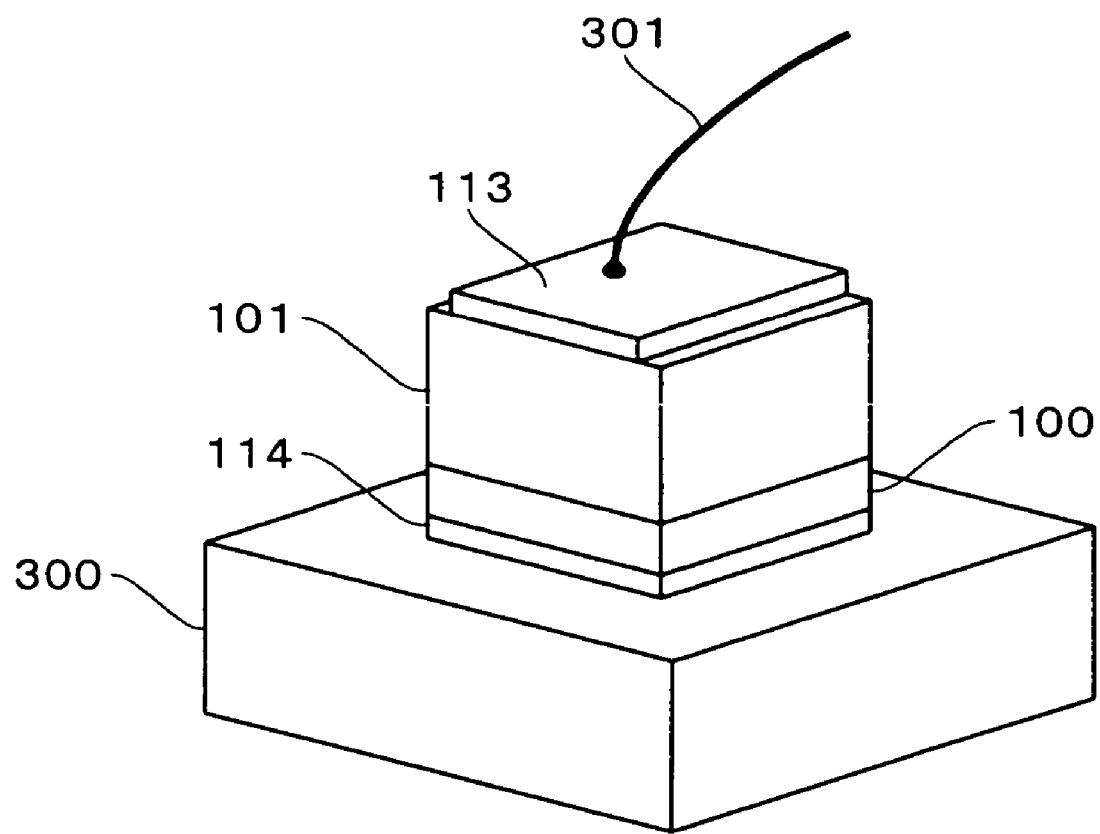
FIG. 5 is a perspective view schematically showing how the semiconductor laser element of any of the embodiments is mounted on a support base to build a semiconductor laser device.

FIG. 5 shows an exterior appearance of the semiconductor laser device of this embodiment. The semiconductor laser element described above is fixed, by being soldered, to a support base 300, with the substrate 100 side of the semiconductor laser element facing downward. On the surface of the support base 300 is laid an Al or Au conductor (not illustrated), and the n-type electrode 114 is electrically connected to this conductor laid on the surface of the support base 300. To the p-type electrode 113 is bonded the wire 301 as described above. Thus, the semiconductor laser device is fed with a drive electric current via the conductor on the surface of the support base 300 and the wire 301. The semiconductor laser devices of the second and third embodiments described below have similar structures.

Second Embodiment

In a second embodiment of the invention, the dislocation-concentrated regions X lie in the shape of dots as shown in FIG. 8E. The dot-shaped dislocation-concentrated regions X lie at intervals of about 400 pm. Ridge structures are formed in middle parts between adjacent dislocation-concentrated regions X, and thereafter p-type electrodes 113 and n-type electrodes 114 are formed. In a case where the dislocation-concentrated regions X are formed in the shape of dots, the surface of the epitaxially grown crystal has better flatness than in elements having line-shaped dislocation-concentrated regions. However, in laser elements of this type also, the metal of which the electrodes are made may cover the dislocation-concentrated region X (FIG. 10).

Figure 6:
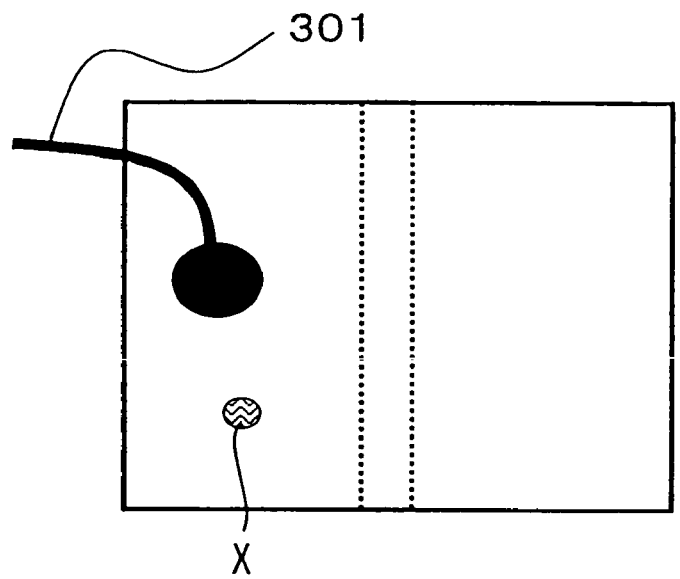
FIG. 6 is a top view schematically showing the semiconductor laser element of a second embodiment of the invention, with a wire connected thereto.

FIG. 6 is a top view of the laser element of this embodiment. Also in this embodiment, to avoid a leak electric current through the dislocation-concentrated region X and thereby prevent deterioration in characteristics, a wire is bonded above the low-dislocation region, i.e., off the area right above the dislocation-concentrated region X.

Third Embodiment

Figure 7:
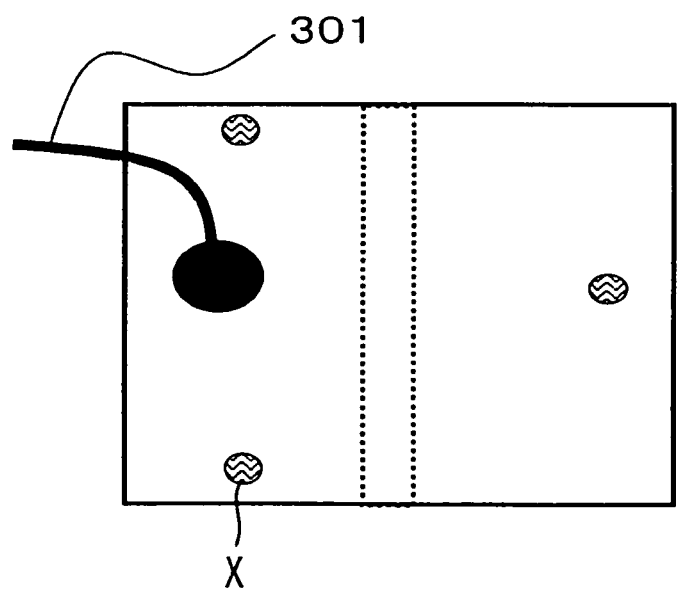
FIG. 7 is a top view schematically showing the semiconductor laser element of a third embodiment of the invention, with a wire connected thereto.

FIG. 7 is a top view of the laser element of a third embodiment of the invention. In this embodiment, the dislocation-concentrated regions X lie in the shape of dots, and the cavity length of the semiconductor laser element is about 700 μm. With the cavity length of this order or more, two or more dislocation-concentrated regions X may be located on the surface of the p-type electrode. Even in this case, to avoid a leak electric current through the dislocation-concentrated region X and thereby prevent deterioration in the characteristics of the semiconductor laser element, a wire is bonded above the low-dislocation region, i.e., off the areas right above the dislocation-concentrated regions X.

Obviously, many modifications and variations of the present invention are possible in light of the above teachings. It is therefore to be understood that within the scope of the appended claims, the invention may be practiced other than as specifically described.

What is claimed is:

1. A nitride semiconductor laser device comprising:
a semiconductor laser element including
a substrate made of a group III nitride semiconductor,
a layered structure formed on a top surface of the substrate and made of a group III nitride semiconductor, and
an electrode formed on a top surface of the layered structure;
a support base for keeping the semiconductor laser element fixed in position; and
a wire connected to the electrode to permit a drive electric current to be fed therethrough to the semiconductor laser element,
wherein the substrate is fabricated from a wafer having
a stripe-shaped dislocation-concentrated region,
a low-dislocation region as a region other than the dislocation-concentrated region, and
a stripe-shaped high-luminescence region formed in the low-dislocation region, wherein the substrate has
a dislocation-concentrated region penetrating the substrate from the top surface to a bottom surface thereof and
a low-dislocation region corresponding to an entire region of the substrate except the dislocation-concentrated region,
wherein the layered structure has a stripe-shaped laser light waveguide region located above the low-dislocation region of the substrate,
wherein the semiconductor laser element is fixed on the support base with a substrate-side surface of the semiconductor laser element facing the support base,
wherein the wire is connected to the p-type electrode above the low-dislocation region, and
wherein the stripe-shaped laser light waveguide region is located between a location where the wire is connected to the p-type electrode and the dislocation-concentrated region.

2. A nitride semiconductor laser device comprising:
a semiconductor laser element including;
a substrate made of a group III nitride semiconductor, and
a layered structure formed on a top surface of the substrate;
a support base for keeping the semiconductor laser element fixed in position; and
a wire connected to the electrode to permit a drive electric current to be fed therethrough to the semiconductor laser element,
wherein the substrate has
a dislocation-concentrated region penetrating the substrate from the top surface to a bottom surface thereof and
a low-dislocation region corresponding to an entire region of the substrate except the dislocation-concentrated region,
wherein the dislocation-concentrated region is dot-shaped as seen from above,
wherein the layered structure has a stripe-shaped laser light waveguide region located above the low-dislocation region of the substrate,
wherein the semiconductor laser element is fixed on the support base with a substrate-side surface of the semiconductor laser element facing the support base,
wherein the wire is connected to the p-type electrode above the low-dislocation region, and
wherein the stripe-shaped laser light waveguide region is locted between a location where the wire is connected to the p-type electrode and the dislocation-concentrated region.

3. A nitride semiconductor laser device comprising:
a semiconductor laser element including
a substrate made of a group III nitride semiconductor,
a layered structure formed on a top surface of the substrate and made of a group III nitride semiconductor, and
an electrode formed on a top surface of the layered structure;
a support base for keeping the semiconductor laser element fixed in position; and
a wire connected to the electrode to permit a drive electric current to be fed therethrough to the semiconductor laser element,
wherein the substrate is obtained by growing the group III nitride semiconductor such that a facet keeps appearing at a surface thereof so that the surface has a serrated sectional shape with ridges and troughs,
wherein the substrate has
a dislocation-concentrated region penetrating the substrate from the top surface to a bottom surface thereof and
a low-dislocation region corresponding to an entire region of the substrate except the dislocation-concentrated region,
wherein the layered structure has a stripe-shaped laser light waveguide region located above the low-dislocation region of the substrate, wherein the semiconductor laser element is fixed on the support base with a substrate-side surface of the semiconductor laser element facing the support base, wherein the wire is connected to the p-type electrode above the low-dislocation region, and wherein the stripe-shaped laser light waveguide region is located between a location where the wire is connected to the p-type electrode and the dislocation-concentrated region.

4. The nitride semiconductor laser device of claim 1, wherein the wire is connected to the electrode above the stripe-shaped high-luminescence region.

5. The nitride semiconductor laser device of claim 2, wherein the substrate has a strip-shaped high-luminescence region formed in the low-dislocation region, and wherein the wire is connected to the electrode above the stripe-shaped high-luminescence region.

6. The nitride semiconductor laser device of claim 3, wherein the substrate has a high-luminescence region formed in the low-dislocation region, and wherein the wire is connected to the electrode above the high-luminescence region.

* * * * *